(12) United States Patent
Ulm et al.

(10) Patent No.: US 8,276,446 B2
(45) Date of Patent: Oct. 2, 2012

(54) SENSOR DEVICE

(75) Inventors: Markus Ulm, Wannweil (DE); Michael Struchholz, Reutlingen (DE); Tristan Jobert, Reutlingen (DE); Klaus Offterdinger, Stuttgart (DE); Thomas Klaus, Tuebingen (DE); Christian Gerhardt, Reutlingen (JP); Florian Grabmaier, Tuebingen (DE); Dirk Dittmann, Eggenstein (DE)

(73) Assignee: Robert Bosch GmbH, Stuttgart (DE)

( * ) Notice: Subject to any disclaimer, the term of this patent is extended or adjusted under 35 U.S.C. 154(b) by 440 days.

(21) Appl. No.: 12/657,751

(22) Filed: Jan. 26, 2010

(65) Prior Publication Data
US 2010/0192689 A1    Aug. 5, 2010

(30) Foreign Application Priority Data
Feb. 3, 2009   (DE) .......................... 10 2009 000 574

(51) Int. Cl.
*G01D 11/10*    (2006.01)

(52) U.S. Cl. ........................................................ 73/430
(58) Field of Classification Search ...................... 73/430
See application file for complete search history.

(56) References Cited

U.S. PATENT DOCUMENTS

| 7,939,937 B2 * | 5/2011 | Holzmann et al. ............ 257/711 |
| 2009/0194860 A1 * | 8/2009 | Holzmann et al. ............ 257/678 |
| 2010/0242605 A1 * | 9/2010 | Offterdinger .............. 73/514.38 |

FOREIGN PATENT DOCUMENTS
DE    10 2006 026 878    12/2007
* cited by examiner

*Primary Examiner* — Lisa Caputo
*Assistant Examiner* — Jamel Williams
(74) *Attorney, Agent, or Firm* — Kenyon & Kenyon LLP (57) ABSTRACT

A sensor device includes a housing base part, a bearer part, a chip structure situated on the bearer part, and a spring/damper combination via which the housing base part and the bearer part are elastically connected to one another. In the sensor device, the housing base part, the spring/damper combination and the bearer part are situated one over the other.

14 Claims, 5 Drawing Sheets

SENSOR DEVICE

BACKGROUND OF THE INVENTION

1. Field of the Invention

The present invention relates to a sensor device having a housing base part, a bearer part, a chip structure situated on the bearer part, and a spring/damper device via which the housing base part and the bearer part are elastically connected to one another.

2. Description of Related Art

Sensor devices used for example in safety systems of motor vehicles standardly have a chip structure that has one or more sensor chips as well as an evaluation chip. The sensor chip is fashioned in the form of a micromechanical component (MEMS: Micro Electro Mechanical System) having movable functional elements in order to acquire a physical measured quantity, such as an acceleration or a rate of rotation. The evaluation chip is used to control the sensor chip, and for the evaluation or further processing of measurement signals of the sensor chip.

A requirement of such sensor devices is that the sensor chips should be decoupled from external mechanical influences, such as vibrations, in order to enable a precise measurement. In a sensor chip for acquiring a rate of rotation, for example, functional elements are excited to oscillate at a prespecified operating frequency. A change in the operating frequency due to external influences causes impairment or falsification of the measurement. Therefore, the chip structure is mounted in a housing that enables a sufficient damping—in the case of a rotational rate sensor, at its operating frequency in particular.

Published German patent document DE 10 2006 026 878 A1 discloses a sensor device having a bearer part for accommodating a chip structure that is situated horizontally inside a frame-shaped housing base part. In an intermediate space between the bearer part and the housing base part, an elastic material is fashioned so that the bearer part can be elastically deflected relative to the housing base part, and a spring suspension or damping of the chip structure is enabled. However, the horizontal situation of the bearer part inside the housing base part entails a relatively large space requirement.

For the electrical contacting, the frame-shaped housing base part has contact elements that are connected to the chip structure situated on the bearer plate via free-standing bonding wires. However, this design results in a low fall stability of the sensor device. A deflection of the bearer part relative to the housing base part that occurs when there is an impact can cause a compression or plastic deformation of the bonding wires, resulting in contacts between the bonding wires and thus to undesired short-circuits in the operation of the sensor device. It is also possible for the bonding wires to be torn or detached from their contact points, interrupting the electrical connection.

BRIEF SUMMARY OF THE INVENTION

An object of the present invention is to provide an improved sensor device and an improved housing for a sensor device.

According to the present invention, a sensor device is provided that has a housing base part, a bearer part, a chip structure situated on the bearer part, and a spring/damper device via which the housing base part and the bearer part are elastically connected to one another. The sensor device is distinguished in that the housing base part, the spring/damper device, and the bearer part are situated one over the other.

Instead of a horizontal situation, with a bearer part provided inside a frame-shaped housing base part, in the sensor device according to the present invention the housing base part, the spring/damper device, and the bearer part are each situated one over the other; i.e., the spring/damper device (or its components) is provided on the housing base part, and the bearer part is provided above the housing base part, on the spring/damper device. Due to this "vertical" construction, the sensor device can be realized with a relatively small (lateral) constructive size. The desired spring suspension and damping function can be set via the choice of material of the components of the spring/damper device, and via their geometrical design.

In an example embodiment, the spring/damper device has a damper element made of a deformable material. The deformable material is preferably liquid silicone rubber, which has both a damping and a spring effect. In this way, it is for example possible to construct the spring/damper device with only one or with a plurality of such damper elements.

In another example embodiment, the spring/damper device has a spring element that is separate from the damper element. In this construction, the spring suspension and damping properties can be realized separately from one another; i.e., in particular the damper element can be designed more specifically for damping and the spring element more specifically for spring suspension, so that the spring and damping properties can be further improved if warranted. A possible spring element is preferably a compression spring or a plate spring.

In another example embodiment, the spring/damper device has, in addition to the damper element, a first connecting element connected to the bearer part and a second connecting element connected to the housing base part. Here, the damper element surrounds the first connecting element and the second connecting element surrounds the damper element. In such a spring/damper device, it is possible for the bearer part and the housing base part not only to be elastically moved toward one another or away from one another, but also to be laterally displaced relative to one another, achieving a decoupling against impacts and vibrations in all spatial directions.

In another example embodiment, the sensor device has contact elements for external contacting that are connected electrically to the chip structure. In addition, the sensor device has a flexible circuit board via which at least a part of the electrical connection between the contact elements and the chip structure is created. Via the flexible circuit board, changes in distance between the bearer part and the housing base part that occur when there are deflections of the bearer part can be correspondingly compensated. In this way, electrical short-circuits and an interruption of the electrical connection between the chip structure and the contact elements are avoided.

The same advantage is offered by another preferred specific embodiment in which the spring/damper device has a spring element via which at least a part of the electrical connection between the contact elements and the chip structure is created. Alternatively, a damper element made of a conductive rubber material can also be used.

In addition, according to the present invention a housing is provided for a sensor device that has a housing base part, a bearer part for bearing a chip structure, and a spring/damper device via which the housing base part and the bearer part are connected elastically to one another. The housing is distinguished in that the housing base part, the spring/damper device, and the bearer part are situated one over the other, enabling a small (lateral) constructive size.

DETAILED DESCRIPTION OF THE INVENTION

The following description explains possible example embodiments of a sensor device according to the present invention, also referred to as a sensor module or a sensor package. Areas of application of the sensor devices include, for example, safety systems of motor vehicles, such as ESP (Electronic Stability Program). The sensor devices have an arrangement for spring suspension and damping in order to decouple a chip structure from external mechanical influences such as impacts or vibrations.

Figure 1:
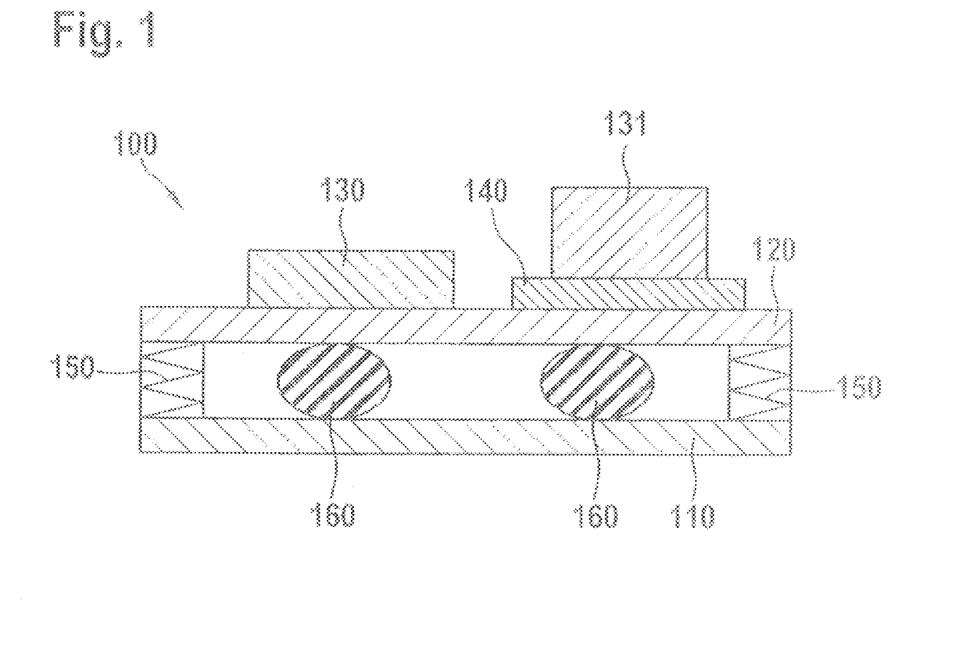
FIGS. 1 through 4 show schematic side views of example embodiments of the sensor device according to the present invention.

FIG. 1 shows a sensor device 100 in a schematic side view. Sensor device 100 has a plate-shaped bearer part 120 for bearing a chip structure, called bearer plate 120 hereinafter. The chip structure includes an evaluation chip 140 and two micromechanical sensor chips 130, 131, of which one is fashioned for example for the acquisition of an acceleration and the other is fashioned for the acquisition of a rate of rotation. Sensor chip 130 and evaluation chip 140 are situated next to one another on an upper side of bearer plate 120, and sensor chip 131 is situated on evaluation chip 140. The fixing of chips 130, 131, 140 takes place for example via adhesive layers (not shown). Evaluation chip 140, which can be fashioned in particular as an application-specific integrated circuit (ASIC), is used to control sensor chips 130, 131 and to evaluate or further process measurement signals of sensor chips 130, 131. For this purpose, evaluation chip 140 is connected electrically to sensor chips 130, 131, for example via bonding wires (not shown). For details concerning possibilities for the electrical contacting, reference is made to specific embodiments of additional sensor devices, described below.

In addition to bearer plate 120, sensor device 100 has a plate-shaped housing base part 110, called base plate 110 hereinafter. Base plate 110 is situated in an area underneath bearer plate 120, essentially parallel to bearer plate 120. Between base plate 110 and bearer plate 120 there is situated a spring/damper device that includes spring elements 150 provided at the edge areas of plates 110, 120, and damper elements 160 situated further in. Via spring and damper elements 150, 160, which are fastened to a lower side of bearer plate 120 and to an upper side of base plate 110 for example by a glue, the two plates 110, 120 are elastically connected to one another, so that plates 110, 120 can to some degree be moved towards one another or away from one another. In particular, micromechanical sensor chips 130, 131, which have functional elements that are movable or that oscillate at a prespecified operating frequency during operation of sensor device 100, can in this way be decoupled from external mechanical influences such as impacts or vibrations, preventing malfunctioning or damage.

The separate construction of spring elements 150 and damper elements 160 makes it possible to set the spring suspension and damping properties of sensor device 100 separately from one another. In particular, spring and damper elements 150, 160 can be optimally matched to one another. A spring element 150 is for example a compression spring, which can be fashioned in particular as a plate spring. As damper element 160, a shaped part is used that is made of a deformable material, such as for example a plastic foam. Alternatively, the use of a rubber material, in particular liquid silicone rubber (LSR), or a gel material such as silicone gel, is also conceivable.

A small lateral constructive size of sensor device 100 results from the vertical situation one over the other of base plate 110, spring and damper elements 150, 160, and bearer plate 120, which has the chip structure. In addition, base plate 110 can be connected to further housing components (not shown). An example is an encapsulation that surrounds bearer plate 120, with the chip structure situated thereon. Base plate 110 can also have contact elements for external contacting. For details of such constructions, see the specific embodiments described below of additional sensor devices.

Figure 2:
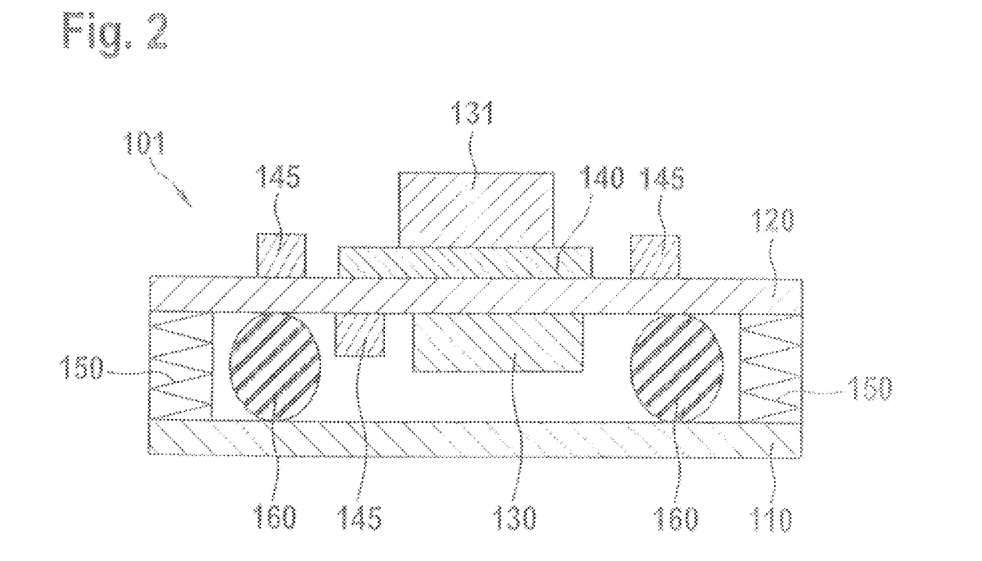

FIG. 2 shows, in a schematic side view, a sensor device 101 that essentially has the same components as sensor device 100 in FIG. 1. In contrast to sensor device 100, in sensor device 101 chips 130, 131, 140 are situated on different sides of bearer plate 120; i.e., sensor chip 130 is provided on a lower side and evaluation chip 140, with sensor chip 131 situated thereon, is provided on an upper side of bearer plate 120. Through this construction, sensor device 101 can be realized in an even more space-saving fashion. In addition, FIG. 2 shows passive components 145 as further possible components of sensor device 101. Passive components 145, including for example resistors, capacitors, and/or coils, can here also be situated in space-saving fashion on the upper and lower side of bearer plate 120, and can be fastened to bearer plate 120 for example by a soldering agent.

Figure 3:
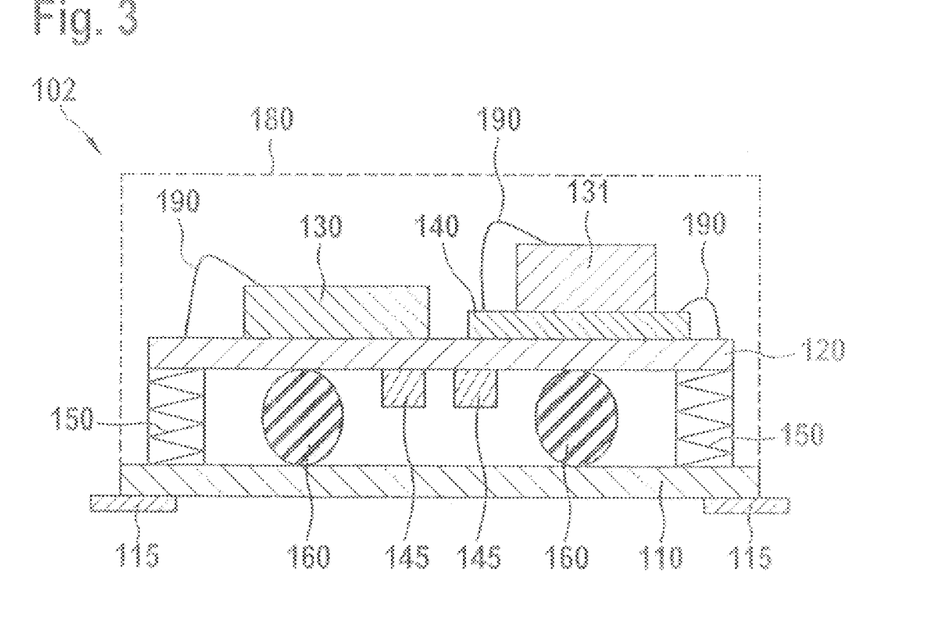

FIG. 3 shows another sensor device 102 in a schematic side view, on the basis of which a possible construction for the electrical contacting is illustrated. Like sensor devices 100, 101 of FIGS. 1 and 2, sensor device 101 has a base plate 110 and a bearer plate 120 that are situated one over the other and are connected elastically to each other via spring elements 150 and damper elements 160. On bearer plate 120 there is situated a chip set having an evaluation chip 140 and two sensor chips 130, 131, as well as passive components 145. For a space-saving construction, chips 130, 131, 140 are situated on an upper side of bearer plate 120, and passive components 145 are situated on a lower side thereof.

Bearer plate 120 is fashioned in the form of a circuit board having a wiring or printed conductor structure, including contact points or surfaces (not shown). As an insulating bearer material, the bearer plate can for example have a plastic or a ceramic. Chips 130, 131, 140, also have contact surfaces for an electrical contacting (not shown). The contacting of chips 130, 131, 140 on bearer plate 120 is created, as shown in FIG. 3, via bonding wires 190 that are connected to contact surfaces of chips 130, 131, 140 and of bearer plate 120 on the upper side thereof. Here, the electrical connection between evaluation chip 140 and sensor chip 131 situated on evaluation chip 140 is made exclusively via bonding wires 190, and the electrical connection between evaluation chip 140 and sensor chip 130 situated next to it is additionally made via bearer plate 120, or the printed conductor structure thereof.

Passive components 145 contact the contact surfaces of bearer plate 120 on its lower side. For this purpose, components 145 are fashioned for example as SMD (surfacemounted device) components and are connected to the contact surfaces via a soldering agent (not shown). Alternatively, the use of an electrically conductive adhesive is possible. The further electrical connection of passive components 145 to the chip structure, or evaluation chip 140, is made via the printed conductor structure of bearer plate 120.

Instead of contacting chips 130, 131, 140 on bearer plate 120 via bonding wires 190, here it is alternatively possible to use SMD assembly techniques (not shown). For example, chips 130, 131, 140 can be fashioned with solder balls in the form of a ball grid array (BGA) on their lower sides, which contact corresponding contact surfaces. It is also possible for bearer plate 120 and chips 130, 131, 140, to have systems of connection surfaces (LGA: land grid arrays) that are matched to one another and that can be contacted to one another via a soldering agent. Instead of a soldering agent, an electrically conductive adhesive can also be used.

For the purpose of external contacting, sensor device 102 is provided with terminals or contact elements 115, which, as shown in FIG. 3, can be fashioned on base plate 110. Contact elements 115 can in particular be fashioned in the form of a lead frame that extends partly through base plate 110. Corresponding to bearer plate 120, base plate 110 can also be fashioned in the form of a circuit board in which for example a plastic or a ceramic is used as an insulating bearer material. For the further electrical connection to the chip structure, or to evaluation chip 140, spring elements 150 are used, which are fashioned as spring contacts via which an electrical current can flow. Spring elements 150 are here connected to contacts or contact surfaces on the lower side of bearer plate 120 and on the upper side of base plate 110, for example via a soldering agent or a conductive adhesive.

In order to protect the chip structure, for example during the installation of sensor device 102 in an automobile or against external influences such as dust or dirt particles, sensor device 102 also has, as indicated in FIG. 3, an encapsulation 180. Encapsulation 180 can for example be fashioned as a separate housing component that is fastened to base plate 110. Alternatively, base plate 110 can also be fashioned as an integral housing part, together with a part of encapsulation 180. Such a housing part can for example include base plate 110 and housing walls connected to base plate 110, the housing walls surrounding spring or damper elements 150, 160 situated one over the other, and bearer plate 120 with the chip structure, in the manner of a frame. In order to complete encapsulation 180, a cover can be attached to the housing walls (not shown).

Instead of via spring elements 150, an electrical connection between base plate 110 and bearer plate 120 can alternatively be created via damper elements 160. For this purpose, damper elements 160 have an electrically conductive rubber material, also called conductive rubber. Such a conductive rubber includes for example a rubber material that is filled with electrically conductive particles such as carbon particles. Here, damper elements 160 contact corresponding terminals or contact surfaces on base plate 110 and on bearer plate 120.

Figure 4:
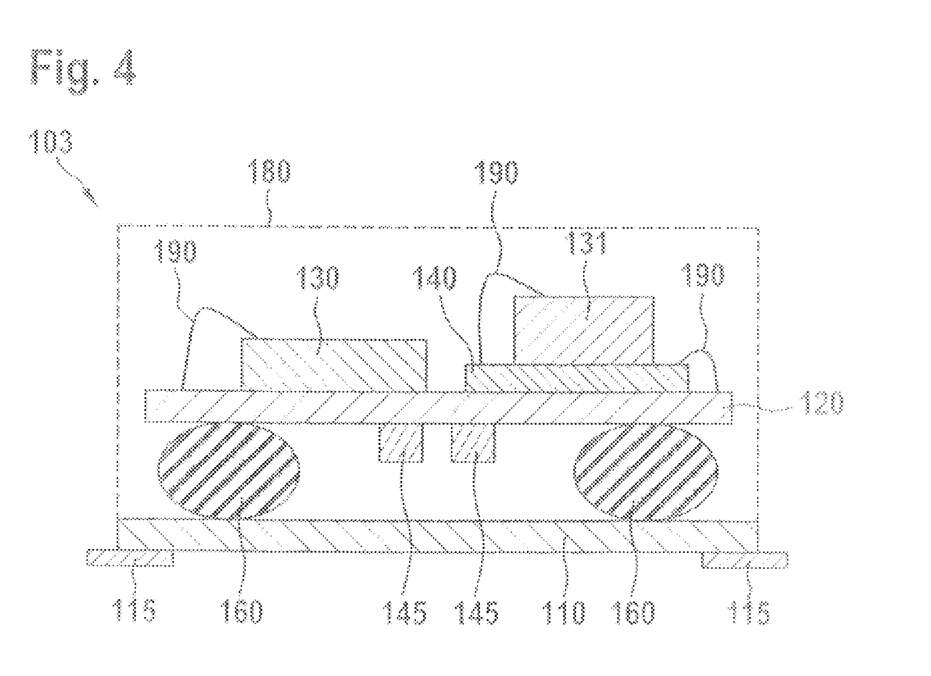

FIG. 4 shows another sensor device 103 that, in contrast to sensor device 102 in FIG. 3, has only damper elements 160 made of a conductive rubber material between bearer plate 120 and base plate 110, and does not have separate spring elements 150. In addition to creating an electrical connection between base plate and bearer plate 110, 120, damper elements 160 are also used for damping and for spring suspension. Such a combination of spring suspension and damping functions can be achieved by a suitable rubber material for damper elements 160, such as in particular liquid silicone rubber.

Figure 5:
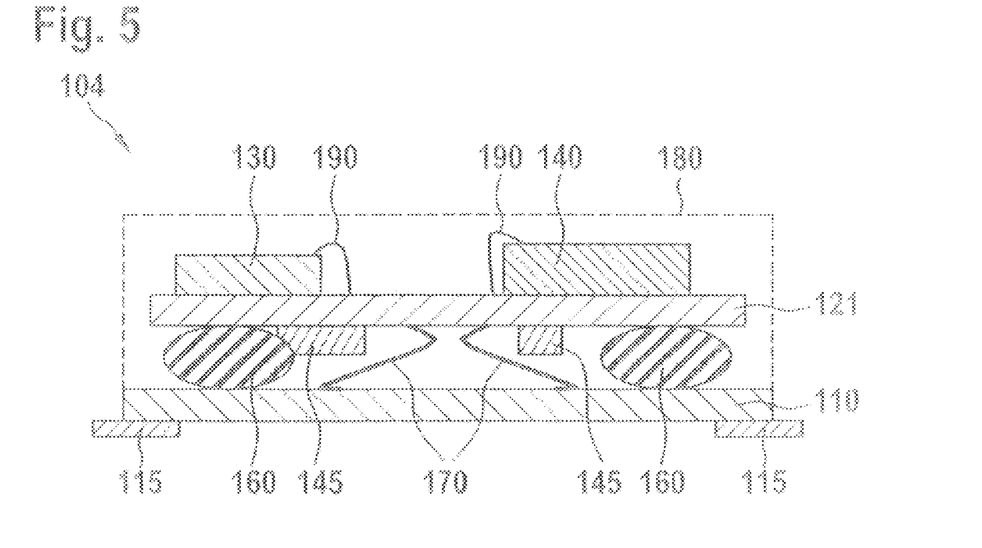
FIGS. 5 and 6 show a schematic side view and a schematic top view, respectively, of a further example embodiment of the sensor device according to the present invention.
Figure 6:
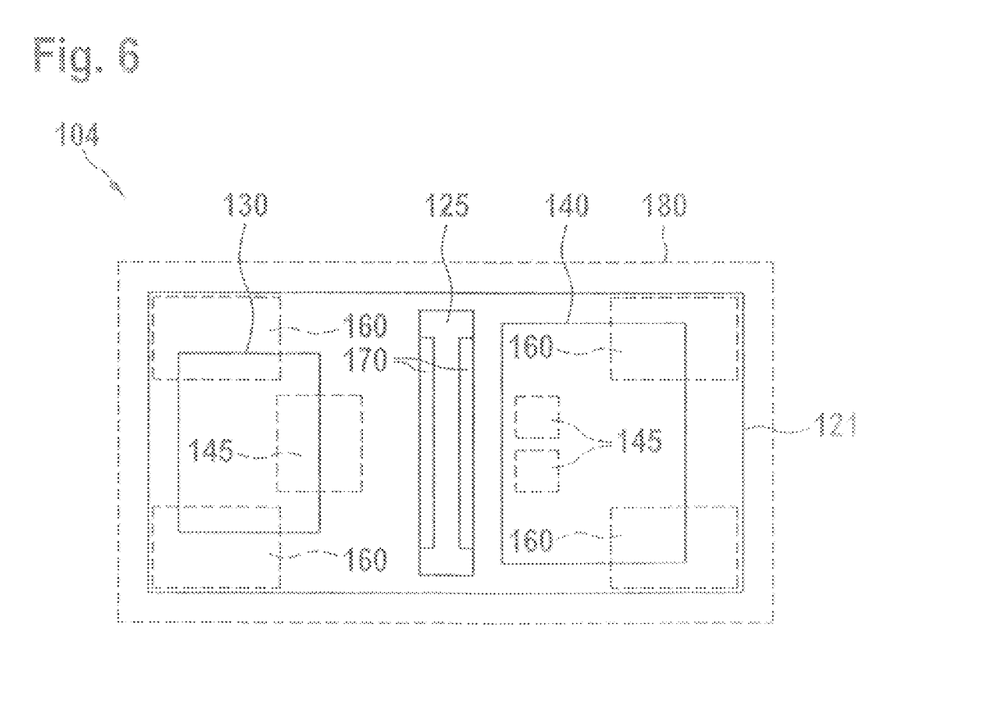

An electrical connection between the base plate and the bearer plate can also be created by components other than those of the spring/damper device. In order to illustrate this, FIGS. 5 and 6 show a sensor device 104 in a schematic side view and a schematic top view. Sensor device 104 has as a chip structure a sensor chip 130 and an evaluation chip 140 that are situated on an upper side of a bearer plate 121. Bearer plate 121 has a printed conductor structure having contact surfaces that are connected to contact surfaces of chips 130, 140 via bonding wires 190. On a lower side of bearer plate 121, passive components 145 are provided whose position is indicated in FIG. 6 by broken lines. Passive components 145 also contact corresponding contact points of bearer plate 121, for example via a soldering agent.

Bearer plate 121 is elastically connected via damper elements 160 to a base plate 110 that has contact elements 115 for external contacting. Damper elements 160 are here simultaneously used for spring suspension and for damping, and have a rubber material such as liquid silicone rubber. As is shown in FIG. 6 by broken lines, damper elements 160 can be situated in corner areas of base plate and bearer plate 110, 121. Alternatively, the damper elements can also be fashioned as continuous formed parts that extend along an overall side edge of bearer plate 121 (not shown).

For the electrical contacting of base plate and bearer plate 110, 121, sensor device 104 has two flexible circuit boards 170. A flexible circuit board 170 includes for example a strip or film made of a flexible plastic material such as for example polyimide, on which there are situated contacts and printed conductors made of an electrically conductive for metallic material (not shown). It is also possible to use two polyimide films and a printed conductor structure situated between the polyimide films, or to use a multilayer circuit board having a plurality of printed conductor planes separated by polyimide films. Instead of the polyimide, alternatively some other flexible or formable plastic material may be used.

Flexible circuit boards 170 are situated in a center area between base plate 110 and bearer plate 121, and are connected for example via a conductive adhesive or via a soldering agent to associated contact surfaces on the upper side of bearer plate 121 and on the upper side of base plate 110. For this purpose, bearer plate 121 has, as shown in FIG. 6, a centrically situated opening 125 through which flexible circuit boards 170 can be routed to the upper side of bearer plate 121. Flexible circuit boards 170 are present in a folded or zigzag shape in sensor device 104, whereby deflections of bearer plate 121 relative to base plate 110 can be compensated without impairing the electrical connection.

Figure 7:
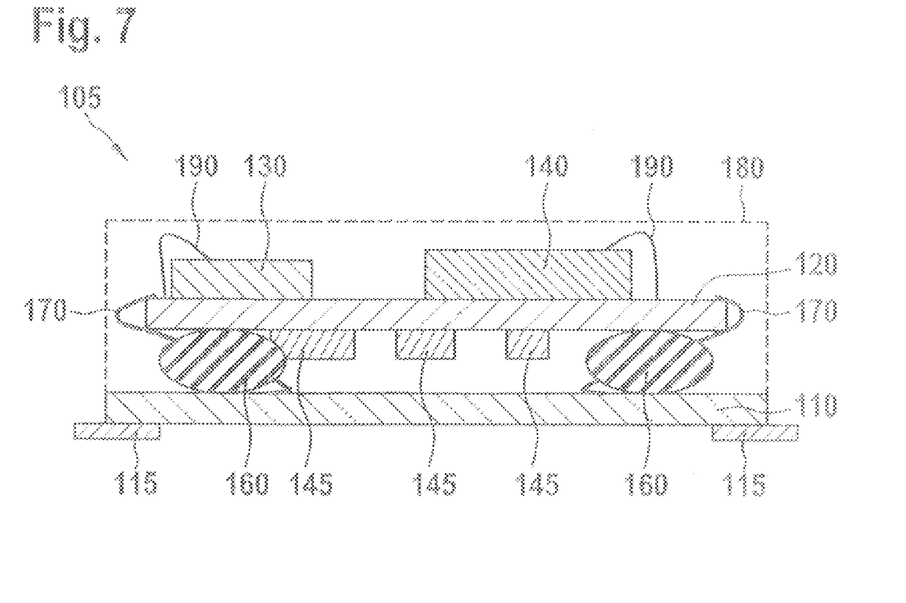
FIGS. 7 and 8 show a schematic side view and a schematic top view, respectively, of another example embodiment of the sensor device according to the present invention.
Figure 8:
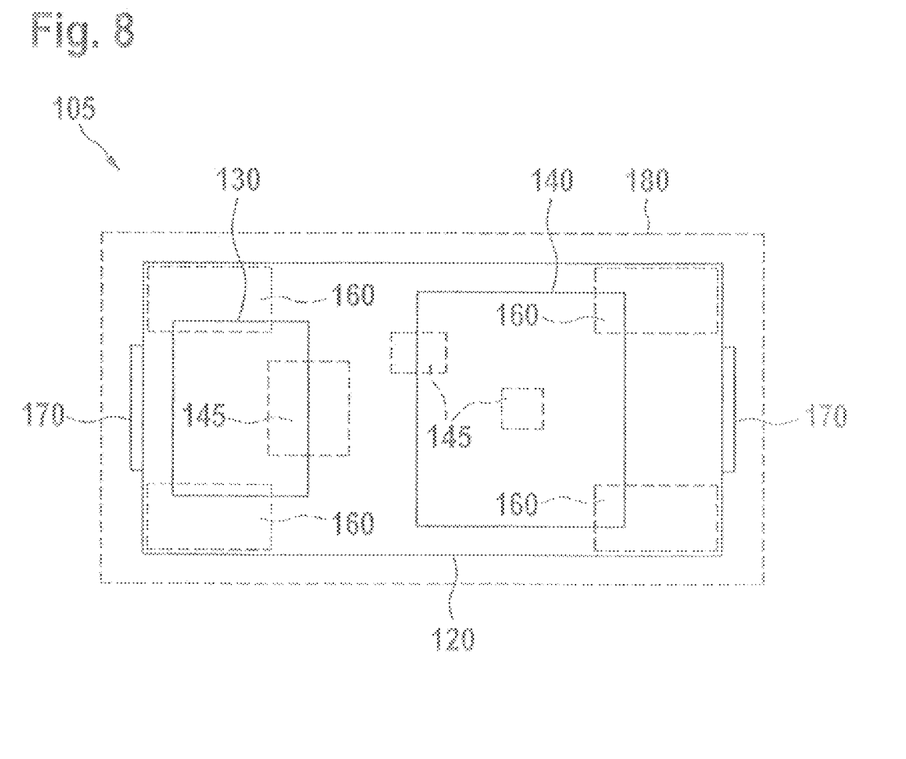

FIGS. 7 and 8 show another sensor device 105 in a schematic side view and in a top view, having essentially the same construction as sensor device 104 of FIGS. 5 and 6. An electrical connection between base plate and bearer plate 110, 120 is again created via two flexible circuit boards 170 that are connected to associated contact surfaces of boards 110, 120 on their upper sides. Instead of in a central area, circuit boards 170 are fastened externally to the edge of bearer plate 120, so that in contrast to bearer plate 121 of sensor device 104, bearer plate 120 does not have a centrically situated opening 125. Circuit boards 170 are again present in folded form, and extend between damper elements 160 that are provided in the area of the corners of base plate and bearer plate 110, 120.

Figure 9:
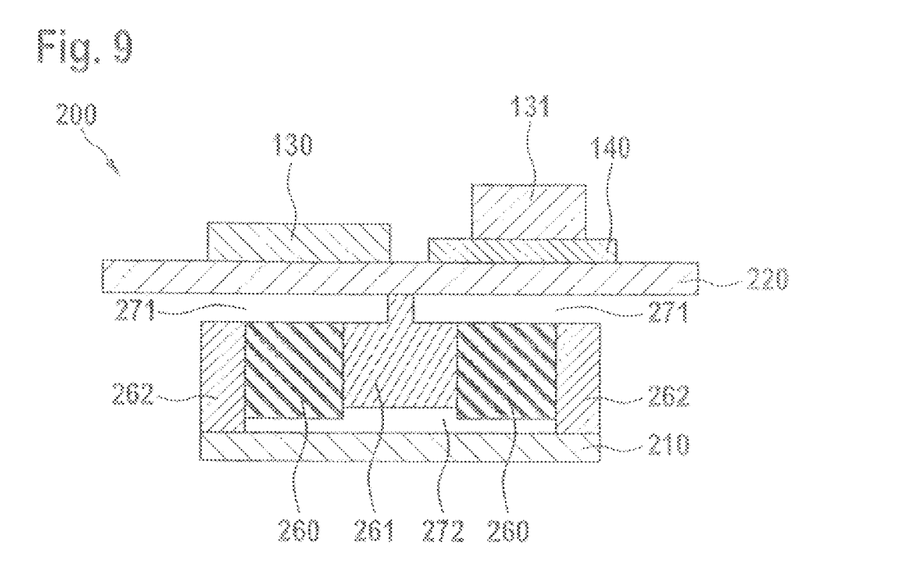
FIGS. 9 and 10 show schematic side views of additional example embodiments of the sensor device according to the present invention.

FIG. 9 shows an additional sensor device 200 in a schematic side view, having a bearer plate 220 and a base plate 210 situated essentially parallel to bearer plate 220, these two plates being elastically connected to one another via a spring/damper device situated between them. On bearer plate 220 there is provided a chip structure that includes an evaluation chip 140 and two sensor chips 130, 131, sensor chip 131 being situated on evaluation chip 140 and sensor chip 130 and evaluation chip 140 being situated next to one another on bearer plate 220. The spring/damper device has a first connecting element 261 that is situated on a lower side of bearer plate 220 or is connected to bearer plate 220. Connecting element 261 has a connecting web that adjoins bearer plate 220 and has, adjacent thereto, a larger segment in which connecting element 261 is surrounded by a damper element 260 made of a deformable material. Also provided is a second connecting element 262 that is situated on an upper side of base plate 210 or is connected to base plate 210, which encloses damper element 260 in the form of a side wall. Both connecting elements 260, 261 can be fashioned as separate components or can be fashioned integrally with plates 210, 220.

Individual components 260, 261, 262 of the spring/damper device are situated in layered fashion around one another, preferably each in circular form around one another. In addition, corresponding openings or gaps 271, 272 are provided between components 260, 261, 262 and plates 210, 220. Through this construction, base plate 210 and bearer plate 220 of sensor device 200 are not only capable of being moved vertically relative to one another, but can also be displaced laterally relative to one another, enabling a decoupling of the chip structure from external mechanical influences in all spatial directions. A possible material for damper element 260, which has both damping and spring suspension properties, is a rubber material such as in particular liquid silicone rubber.

Instead of forming first connecting element 261 with a small connecting web adjoining bearer plate 220 and a larger segment surrounded by damper element 260, first connecting element can also be provided without such a connecting web (not shown). In such a construction, damper element 260 can likewise be situated on the first connecting element at a distance from bearer plate 220, in order to form a gap 271 between bearer plate 220 and damper element 260.

Figure 10:
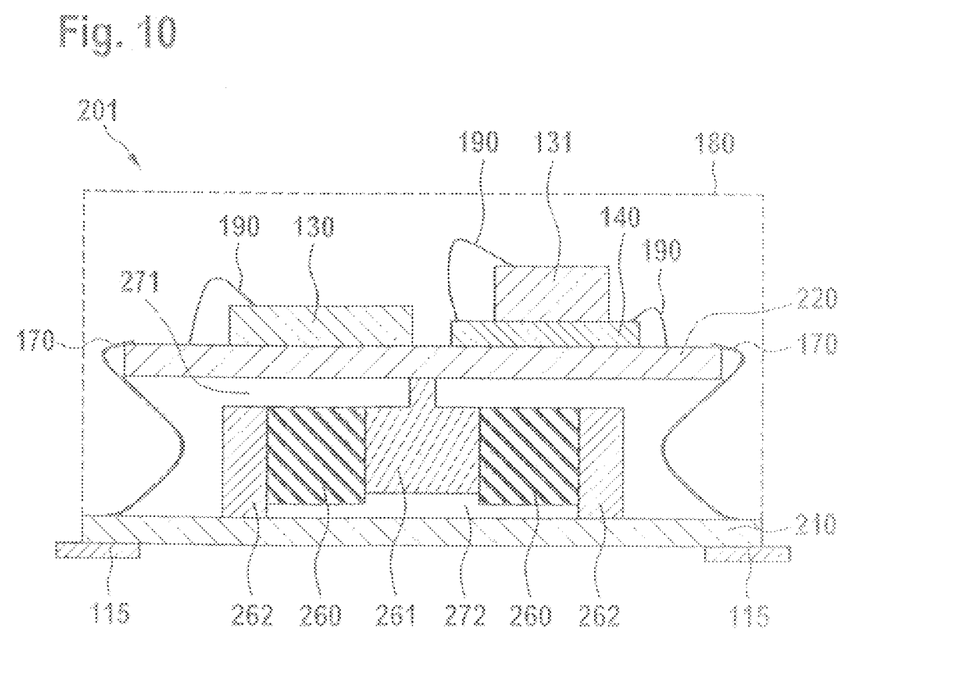

FIG. 10 shows, in a schematic side view, a first sensor device 201, having a spring/damper device corresponding to sensor device 200 of FIG. 9, and on the basis of which a possible construction for the electrical contacting is illustrated. Chips 130, 131, 140 provided on bearer plate 220 are electrically connected among one another and to bearer plate 220 via bonding wires 190 that contact the contact surfaces of chips 130, 131, 140 and of bearer plate 220. Here, bearer plate 220 is again fashioned in the form of a circuit board having a wiring or printed conductor structure. For the electrical connection of base plate and bearer plate 210, 220, sensor device 201 has two flexible circuit boards 170 that are fastened in the area of the side edges on the upper sides of plates 210, 220 and that contact corresponding contact surfaces of plates 210, 220. Base plate 210 has contact elements 115 for external contacting that extend through base plate 210, for example in the form of a lead frame. Also provided is an encapsulation 180 that is connected to base plate 210, or adjoins base plate 210, and that protects the chip structure. For further details concerning this, please refer to the foregoing explanations.

The sensor devices explained on the basis of the Figures represent example embodiments of the present invention. In addition, additional specific embodiments are possible that include further modifications and combinations of the described sensor devices. For example, sensor devices 200, 201 shown in FIGS. 9 and 10 may have a different chip structure and/or additional passive components that can also be situated on different sides of bearer plate 220. Instead of bonding wires 190, alternative contacting possibilities may be used, such as in particular SMD assembly techniques.

With regard to the sensor devices shown in FIGS. 1 through 8, specific embodiments are conceivable that have a different number and/or a different construction of spring and/or damper elements. An example is the provision of an individual damper element (or spring element) that is surrounded by a circular spring element (or damper element).

In addition, specific embodiments of sensor devices are conceivable in which the base plate adjoins further housing components or is connected (mechanically and electrically) to such components, such that only these further components have contact elements for an external contacting. Instead of a plate-shaped geometry, a bearer part and/or a housing base part may also have a different shape.

What is claimed is:

1. A sensor device, comprising:
   a housing base part;
   a bearer part;
   a chip structure situated on the bearer part; and
   at least one of a spring element and a damper element, wherein the housing base part and the bearer part are elastically connected to one another by the at least one of the spring element and the damper element;
   wherein (a) the housing base part, (b) the at least one of the spring element and the damper element, and (c) the bearer part are situated one over the other.

2. The sensor device as recited in claim 1, wherein the damper element is made of a deformable material.

3. The sensor device as recited in claim 2, wherein the deformable material is liquid silicone rubber.

4. The sensor device as recited in claims 2, wherein the sensor device includes both the spring element and the damper element, and wherein the spring element is separate from the damper element.

5. The sensor device as recited in claim 4, wherein the spring element is one of a compression spring or a plate spring.

6. The sensor device as recited in claim 1, wherein the damper element has a first connecting element connected to the bearer part and a second connecting element connected to the housing base part, and wherein the damper element surrounds the first connecting element, and wherein the second connecting element surrounds the damper element.

7. The sensor device as recited in claim 1, further comprising:
   at least one contact element for external contacting, wherein the at least one contact element is electrically connected to the chip structure; and
   a flexible circuit board, wherein at least a part of the electrical connection between the at least one contact element and the chip structure is achieved by the flexible circuit board.

8. The sensor device as recited in claim 1, further comprising:
   at least one contact element for external contacting, wherein the at least one contact element is electrically connected to the chip structure;
   wherein the spring element achieves at least a part of the electrical connection between the at least one contact element and the chip structure.

9. The sensor device as recited in claim 1, further comprising:
   at least one contact element for external contacting, wherein the at least one contact element is electrically connected to the chip structure;
   wherein the damper element is made of a conductive rubber material, and wherein the damper element achieves at least a part of the electrical connection between the at least one contact element and the chip structure.

10. The sensor device as recited in claim 1, wherein the sensor device includes both the spring element and the damper element, and wherein the spring element and the damper element is embodied in a single element made of a deformable material.

11. The sensor device as recited in claim 10, wherein the damper element has a first connecting element connected to the bearer part and a second connecting element connected to the housing base part, and wherein the damper element surrounds the first connecting element, and wherein the second connecting element surrounds the damper element.

12. The sensor device as recited in claim 10, further comprising:
- at least one contact element for external contacting, wherein the at least one contact element is electrically connected to the chip structure; and
- a flexible circuit board, wherein at least a part of the electrical connection between the at least one contact element and the chip structure is achieved by the flexible circuit board.

13. The sensor device as recited in claim 10, further comprising:
- at least one contact element for external contacting, wherein the at least one contact element is electrically connected to the chip structure;
- wherein the spring element achieves at least a part of the electrical connection between the at least one contact element and the chip structure.

14. The sensor device as recited in claim 10, further comprising:
- at least one contact element for external contacting, wherein the at least one contact element is electrically connected to the chip structure;
- wherein the damper element is made of a conductive rubber material, and wherein the damper element achieves at least a part of the electrical connection between the at least one contact element and the chip structure.

* * * * *